(12) United States Patent
Kleindienst et al.

(10) Patent No.: US 12,470,152 B2
(45) Date of Patent: Nov. 11, 2025

(54) PULSE INVERTER AND METHOD FOR COOLING A PULSE INVERTER

(71) Applicant: Dr. Ing. h.c. F. Porsche Aktiengesellschaft, Stuttgart (DE)

(72) Inventors: Maurice Kleindienst, Woerth am Rhein (DE); Sebastian Wachter, Pressig (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 239 days.

(21) Appl. No.: 18/464,283

(22) Filed: Sep. 11, 2023

(65) Prior Publication Data
US 2024/0097578 A1    Mar. 21, 2024

(30) Foreign Application Priority Data
Sep. 19, 2022 (DE) ............ 10 2022 123 893.8

(51) Int. Cl.
*H05K 7/20* (2006.01)
*H02M 7/00* (2006.01)

(52) U.S. Cl.
CPC ........ *H02M 7/003* (2013.01); *H05K 7/20927* (2013.01)

(58) Field of Classification Search
CPC .... H02M 7/003; H02M 7/537; H02M 7/5395; H05K 7/1432; H05K 7/20154; H05K 7/20236; H05K 7/20254; H05K 7/20272; H05K 7/20281; H05K 7/20327; H05K 7/2039; H05K 7/20763; H05K 7/20854; H05K 7/2089; H05K 7/20927; H05K 1/181; H01L 23/34; H01L 23/367; H01L 23/3675; H01L 23/473; H02P 27/06; H02P 27/08; H02P 27/085; B60L 50/51; B60L 50/60;
(Continued)

(56) References Cited

U.S. PATENT DOCUMENTS

| 10,906,407 B2 * | 2/2021 | Sainsaulieu ........ H05K 7/20336 |
| 2005/0259402 A1 * | 11/2005 | Yasui ................ H05K 7/20927 |
| | | 361/699 |

(Continued)

FOREIGN PATENT DOCUMENTS

| DE | 102004063986 A1 * | 7/2006 | .............. B60L 50/40 |
| EP | 1858313 B1 | 9/2013 | |
| JP | H1154356 * | 2/1999 | ............... B60K 8/00 |

OTHER PUBLICATIONS

JPH1154356 English Translation (Year: 1999).*
DE-102004063986-A1 English Translation (Year: 2006).*

*Primary Examiner* — Amir A Jalali
(74) *Attorney, Agent, or Firm* — LEYDIG, VOIT & MAYER, LTD.

(57) ABSTRACT

A pulse inverter includes a plurality of power modules, at least one capacitor assembly with a plurality of capacitors, at least one power module cooling channel configured to be perfused by a cooling fluid in order to cool the power modules, and at least one capacitor cooling channel configured to be perfused by a cooling fluid in order to cool the capacitors. The pulse inverter also includes a plurality of connection channels extending between the at least one power module cooling channel and the at least one capacitor cooling channel, the connection channels being configured to be perfused by the cooling fluid.

10 Claims, 1 Drawing Sheet

(58) Field of Classification Search
CPC .. H02K 5/04; H02K 9/00; H02K 9/19; H02K 11/0094; H02K 11/33; H02K 2209/00
See application file for complete search history.

(56) References Cited

U.S. PATENT DOCUMENTS

| | | | |
|---|---|---|---|
| 2010/0182747 A1* | 7/2010 | Yoshida | H05K 7/20927 361/689 |
| 2018/0146577 A1* | 5/2018 | Ide | H05K 7/20272 |
| 2022/0352788 A1* | 11/2022 | Barkow | H02K 9/19 |
| 2023/0397380 A1* | 12/2023 | Wachter | B60L 50/60 |
| 2023/0412052 A1* | 12/2023 | Mizuno | H02K 11/33 |
| 2024/0215211 A1* | 6/2024 | Matsuoka | H02M 7/5387 |

* cited by examiner

PULSE INVERTER AND METHOD FOR COOLING A PULSE INVERTER

CROSS REFERENCE TO RELATED APPLICATIONS

This application claims benefit to German Patent Application No. DE 10 2022 123 893.8, filed on Sep. 19, 2022, which is hereby incorporated by reference herein.

FIELD

The present invention relates to a pulse inverter and a method for cooling a pulse inverter.

BACKGROUND

A pulse inverter is a power electronic component, which is used, for example, in a powertrain of an electric vehicle. The purpose of such a pulse inverter is to convert a DC voltage of a traction battery of the electric vehicle into a variable-frequency voltage by means of which at least one electric machine of the electric vehicle can be operated.

During the operation of the pulse inverter, it is necessary to effectively cool the power modules as well as the capacitors of the capacitor assembly. The power modules and the capacitor assembly are therefore each associated with one or more cooling channels that are perfused by a cooling fluid, such as oil or water, during the operation of the pulse inverter in order to cool the power modules as well as the capacitors. In the solutions known from the prior art thus far, a cooling of the power modules takes place in sequence. Thus, the cooling fluid is the coldest in the first perfused power module and the warmest in the last perfused power module. Analogously, the capacitors of the capacitor assembly are also cooled in sequence. The perfusion of the at least one power module cooling channel with the cooling fluid can be directed counter to the perfusion of the at least one capacitor cooling channel.

From this cooling principle described above, mechanical stresses result in the region of the cooling channels, which make an effective sealing more difficult. Because, in addition, all power modules are configured as like parts, only the last power module in a module series experiences the highest thermal load. All remaining power modules thus have excessive thermal dimensions. Furthermore, the power modules must be designed for a relatively wide temperature range, because they are exposed to different cooling fluid temperatures.

EP 1 858 313 B1 discloses a vehicle with an electric motor and a water-cooled power inverter connected thereto, whose power modules and capacitors are housed in a metal housing. A heat sink of the inverter defines channels running parallel to one another with corresponding openings. Each of the power modules consists of a metallic base plate, which supports on the one hand the semiconductor chips and on the other hand a blade for heat dissipation.

SUMMARY

In an embodiment, the present disclosure provides a pulse inverter comprising a plurality of power modules, at least one capacitor assembly with a plurality of capacitors, at least one power module cooling channel configured to be perfused by a cooling fluid in order to cool the power modules, and at least one capacitor cooling channel configured to be perfused by a cooling fluid in order to cool the capacitors. The pulse inverter also comprises a plurality of connection channels extending between the at least one power module cooling channel and the at least one capacitor cooling channel, the connection channels being configured to be perfused by the cooling fluid.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
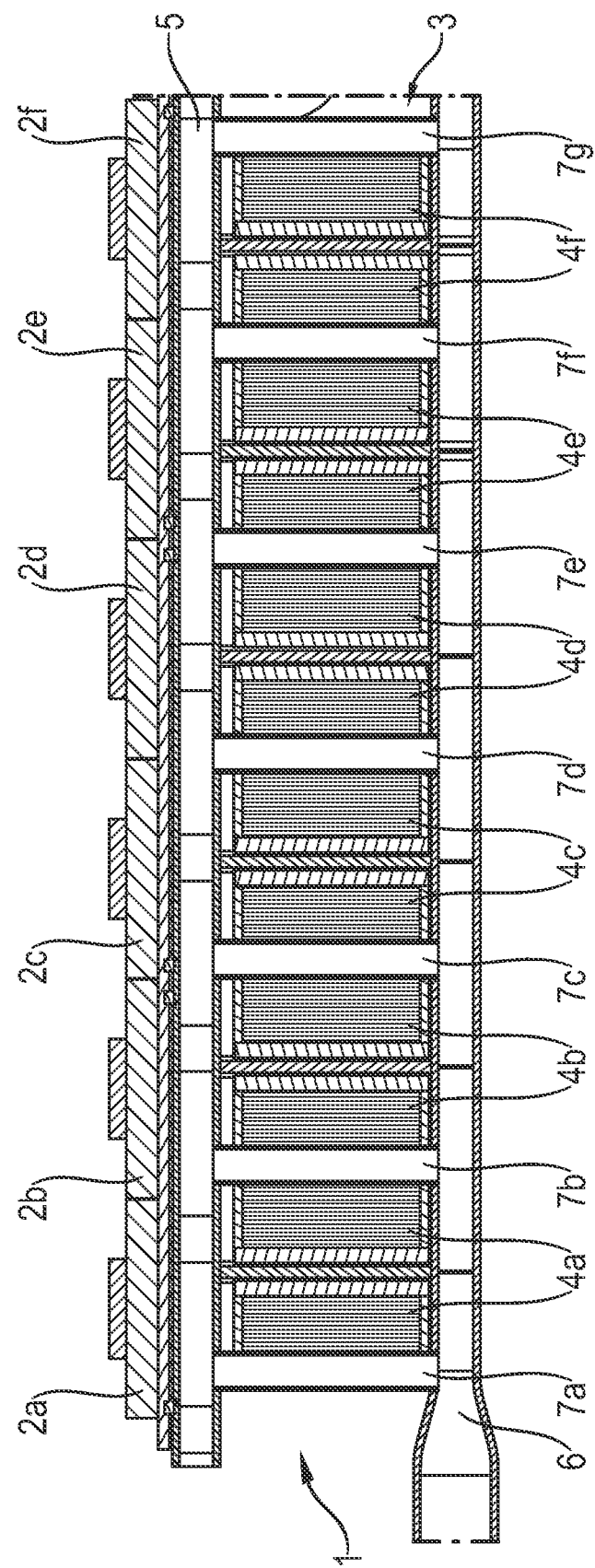
FIG. 1 shows a section through a pulse inverter.

In an embodiment, a pulse inverter is provided, as well as a method for cooling a pulse inverter, by means of which an improved cooling of the power modules as well as the capacitors of the capacitor assembly can be achieved compared to the prior art.

In an embodiment, a pulse inverter comprises a plurality of power modules, at least one capacitor assembly having a plurality of capacitors, at least one power module cooling channel configured so as to be perfused by cooling fluid in order to cool the power modules, and at least one capacitor cooling channel configured so as to be perfused by a cooling fluid in order to cool the capacitors.

A pulse inverter according to an embodiment of the invention is characterized in that the pulse inverter comprises a plurality of connection channels extending between the at least one power module cooling channel and the at least one capacitor cooling channel and which are configured so as to be perfused by the cooling fluid. An embodiment of the invention advantageously provides an improved cooling of the power modules as well as the capacitors of the capacitor assembly.

In an embodiment, the connection channels are tubular in form. Such tubular connection channels can be manufactured very simply and inexpensively.

In a preferred embodiment, the connection channels are arranged within the capacitor assembly. As a result, a particularly effective cooling of the capacitors of the capacitor assembly can be achieved.

In an embodiment, there is a possibility that the capacitors are cylindrical in shape.

In an embodiment, it can be provided that the capacitors of the capacitor assembly are arranged adjacent to one another in at least two capacitor rows. Each of the capacitor rows comprises at least two capacitors.

Preferably, multiple interstices can be formed between the capacitor rows, in which one of the connection channels is respectively formed. This results in corresponding package advantages.

According to an embodiment, a method is provided for cooling a pulse inverter, in which it is provided that the cooling fluid is collected in the at least one capacitor cooling channel of the capacitor assembly and subsequently transported through the connection channels to the at least one power module cooling channel and perfuses it in order to cool the power modules. The cooling sequence provided, in which first the capacitors of the capacitor assembly and then the power modules are cooled, assumes that the cooling requirement of the capacitors is significantly lower than the cooling requirement of the power modules. Under thermal aspects, it is thus more advantageous with regard to the heating of the cooling fluid to first cool the capacitors of the capacitor assembly and only then cool the power modules.

In an embodiment, the cooling fluid cools further components, in particular power buses, after perfusing the power module cooling channel. This advantageously further increases the cooling efficiency.

In a preferred embodiment, a cooling oil is used as the cooling fluid.

Further features and advantages of embodiments of the present invention will become apparent from the following description of a preferred embodiment example with reference to FIG. 1, which shows a section through a pulse inverter 1.

This pulse inverter 1 is a power electronic component, which is used, for example, in a powertrain of an electric vehicle. The purpose of such a pulse inverter is to convert a DC voltage of a traction battery of the electric vehicle into a variable-frequency voltage by means of which at least one electric machine of the electric vehicle can be operated.

The pulse inverter 1 comprises a plurality of power modules 2a-2f arranged one behind the other in at least one module row, as well as at least one capacitor assembly 3 having a plurality of capacitors 4a-4f. In the present case, a total of six power modules 2a-2f are arranged one behind the other in a first direction (x direction).

The capacitors 4a-4f are cylindrical in shape and are arranged below the power modules 2a-2f. Preferably, the capacitors 4a-4f are arranged in multiple adjacent capacitor rows, i.e. one behind the other in the first direction (x direction) and adjacent to one another in a second direction that extends perpendicular to the first direction and thus into the drawing plane of FIG. 1. For example, the capacitor assembly 3 can comprise three capacitor rows adjacent to one another, each having six capacitors 4a-4f.

The pulse inverter 1 further comprises at least one power module cooling channel 5 configured so as to be perfused by a cooling fluid in order to cool the power modules 2a-2f. Furthermore, the pulse inverter 1 comprises at least one capacitor cooling channel 6 configured so as to be perfused by a cooling fluid in order to cool the capacitors 4a-4f.

Due to the fact that the capacitors 4a-4f of the capacitor assembly 3 are cylindrical in shape and are arranged in multiple capacitor rows, corresponding interstices result in which one of the connection channels 7a-7g is preferably respectively formed. The connection channels 7a-7g thus extend within the capacitor assembly 3 between the at least one power module cooling channel 5 and the at least one capacitor cooling channel 6 so that corresponding fluid connections between these channels are provided. The connection channels 7a-7g are preferably tubular in form. As a result, it is achieved that the connection channels 7a-7g can be manufactured very simply and inexpensively.

The fluid flow of the cooling fluid for cooling the pulse inverter 1, which can in particular be a cooling oil, is carried out in the following manner: In the capacitor cooling channel 6 of the capacitor assembly 3, the cooling fluid is first collected. Through the connection channels 7a-7g, the cooling fluid is subsequently transported to the power module cooling channel 5 of the power modules 2a-2f. Because the connection channels 7a-7g are located in the region of the cylindrical capacitors 4a-4f of the capacitor assembly 3, the entire capacitor assembly 3 can thus also be cooled very efficiently. While perfusing the power module cooling channel 5, the cooling fluid also cools the power modules 2a-2f very efficiently. Subsequently, the cooling fluid exits the power module cooling channel 5 of the pulse inverter 1 and can, for example, subsequently cool further components, such as power buses.

The cooling sequence disclosed herein, in which first the capacitors 4a-4f of the capacitor assembly 3 and then the power modules 2a-2f are cooled, assumes that the cooling requirement of the capacitors 4a-4f is significantly lower than the cooling requirement of the power modules 2a-2f. Under thermal aspects, it is thus more advantageous with regard to the heating of the cooling fluid to first cool the capacitors 4a-4f of the capacitor assembly 3 and only then cool the power modules 2a-2f.

Due to the type of cooling of the capacitors 4a-4f of the capacitor assembly 3 and the power modules 2a-2f discussed herein, advantageously all power modules 2a-2f are thermally equally loaded or at least nearly equally loaded and can thus be designed for a significantly narrower temperature range. Because the thermal load is uniform over the entire length of the cooling channels, in particular the power module cooling channel 5, the mechanical stresses resulting from high temperature gradients within the power module cooling channel 5 in the prior art can be significantly reduced. As a result, the sealing concept and the assembly of the power module cooling channel 5 as well as the capacitor cooling channel 6 can be significantly simplified. This results in corresponding cost advantages in the manufacture of the pulse inverter 1.

Because the oil supply of the power module cooling channel 5 of the power modules 2a-2f is implemented by the capacitor assembly 3, the cooling of the capacitors 4a-4f can also be significantly improved without additional effort. Because the fluid guidance is carried out directly through the connection channels 7a-7g between the capacitors 4a-4f within the capacitor assembly 3, advantageously no external cooling fluid lines are required, so that corresponding package advantages result.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements.

The invention claimed is:

1. A pulse inverter comprising:
   a plurality of power modules;
   at least one capacitor assembly with a plurality of capacitors;
   at least one power module cooling channel configured to be perfused by a cooling fluid in order to cool the power modules;
   at least one capacitor cooling channel configured to be perfused by the cooling fluid in order to cool the capacitors; and
   a plurality of connection channels extending between the at least one power module cooling channel and the at least one capacitor cooling channel, the connection channels being configured to be perfused by the cooling fluid.

2. The pulse inverter according to claim 1, wherein the connection channels are tubular in form.

3. The pulse inverter according to claim 1, wherein the connection channels are arranged within the capacitor assembly.

4. The pulse inverter according to claim 1, wherein the capacitors are cylindrical in shape.

5. The pulse inverter according to claim 1, wherein the capacitors of the capacitor assembly are arranged side-by-side in at least two capacitor rows.

6. The pulse inverter according to claim 5, wherein multiple interstices are formed between capacitor rows in which one of the plurality of connection channels is respectively formed.

7. A method for cooling the pulse inverter according to claim 1, comprising:
   collecting the cooling fluid in the at least one capacitor cooling channel of the capacitor assembly; and
   subsequently transporting the cooling fluid through the connection channels to the at least one power module cooling channel and perfusing it in order to cool the power modules.

8. The method according to claim 7, wherein the cooling fluid cools further components after perfusing the power module cooling channel.

9. The method according to claim 8, wherein the further components are power buses.

10. The method according to claim 7, the cooling fluid is a cooling oil.

* * * * *